(12) United States Patent
Huang et al.

(10) Patent No.: US 9,548,268 B2
(45) Date of Patent: Jan. 17, 2017

(54) SEMICONDUCTOR DEVICE HAVING BILAYER METAL LAYER

(71) Applicant: UNITED MICROELECTRONICS CORP., Hsin-Chu (TW)

(72) Inventors: Chun-Chi Huang, Tainan (TW); Yung-Hung Yen, Tainan (TW); Hsin-Hsing Chen, Ping-Tung County (TW); Chih-Yueh Li, Taipei (TW); Tsun-Min Cheng, Changhua County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 8 days.

(21) Appl. No.: 14/731,394

(22) Filed: Jun. 4, 2015

(65) Prior Publication Data

US 2016/0322299 A1 Nov. 3, 2016

(30) Foreign Application Priority Data

Apr. 28, 2015 (TW) .............................. 104113556 A

(51) Int. Cl.
*H01L 23/522* (2006.01)
*H01L 23/528* (2006.01)
*H01L 23/532* (2006.01)

(52) U.S. Cl.
CPC ......... *H01L 23/5226* (2013.01); *H01L 23/528* (2013.01); *H01L 23/53238* (2013.01)

(58) Field of Classification Search
CPC ............... H01L 23/5226; H01L 23/522; H01L 23/53238; H01L 23/528; H01L 23/532
See application file for complete search history.

(56) References Cited

U.S. PATENT DOCUMENTS

| 7,179,759 B2 | 2/2007 | Huang et al. |
| 2002/0030274 A1* | 3/2002 | Chopra ............... H01L 21/2885 257/751 |
| 2006/0068604 A1 | 3/2006 | Huang et al. |

OTHER PUBLICATIONS

Jiang et al., The structure and stability of beta-Ta thin films, Jun. 2, 2004.

\* cited by examiner

*Primary Examiner* — Selim Ahmed
(74) *Attorney, Agent, or Firm* — Winston Hsu; Scott Margo

(57) ABSTRACT

A semiconductor device includes an opening, a metal nitride layer, a bilayer metal layer and a conductive bulk layer. The opening is disposed in a first dielectric layer. The metal nitride layer is disposed in the opening. The bilayer metal layer is disposed on the metal nitride layer in the opening, where the bilayer metal layer includes a first metal layer and a second metal layer which is disposed on the first metal layer and has a greater metal concentration than that of the first metal layer. The conductive bulk layer is filled in the opening.

7 Claims, 4 Drawing Sheets

SEMICONDUCTOR DEVICE HAVING BILAYER METAL LAYER

BACKGROUND OF THE INVENTION

1. Field of the Invention

The invention relates to a semiconductor device, and more particularly, to a semiconductor device having a plug structure with low resistance capacitance (Rc).

2. Description of the Prior Art

In the fabrication of semiconductor integrated circuits (ICs), semiconductor devices are generally connected by several metallic interconnecting layers commonly referred to as multi-level interconnects, and a damascene process is a convenient and predominant method for forming the multi-level interconnects. To meet the need of high integration and high processing speed of semiconductor integrated circuits of nano-scale generations, copper interconnect technology has become an effective solution. In comparison with aluminum or other metals, copper has relatively lower resistivity and fewer reliability concerns, such as electromigration, which may further cooperate with low permittivity (low-k) dielectric materials between those metal interconnects, so as to reduce cross talk and/or resistance-capacitance (RC) delay thereof. Thus, copper interconnect technology has been widely in use in single damascene structure and dual damascene structure processes.

One concern with the use of copper as interconnect material is its diffusion property. To prevent copper from diffusing into the ILD layer, the copper core of the damascene structure is typically encapsulated with a diffusion barrier metal. Typical diffusion barrier metals include tantalum (Ta), tantalum nitride (TaN), titanium nitride (TiN) or titanium (Ti) for encapsulating a copper core. Among these barrier materials, tantalum is more prevalent than others in the semiconductor industry because of its relatively higher thermal reliability and ability to prevent copper diffusion. As the line width shrinks to 65 nm or 45 nm node, it is desirable to form a diffusion barrier with reduced thickness and resistance, while maintaining the ability to prevent copper diffusion. Consequently, how to improve the semiconductor integrated circuit for obtaining efficient performance is still an important issue in the field.

SUMMARY OF THE INVENTION

It is one of the primary objectives of the present invention to provide a novel semiconductor device, which includes a plug structure with a low resistance capacitance (Rc), so that semiconductor devices may provide preferred element performances.

To achieve the purpose described above, one embodiment of the present invention provides a semiconductor device including an opening disposed in a first dielectric layer, a metal nitride layer, a bilayer metal layer and a conductive bulk layer. The metal nitride layer is disposed in the opening. The bilayer metal layer is disposed on the metal nitride layer in the opening, wherein the bilayer metal layer includes a first metal layer and a second metal layer disposed on the first metal layer and having a greater metal concentration than that of the first metal layer. The conductive bulk layer is filled in the opening.

To achieve the purpose described above, another embodiment of the present invention provides a semiconductor device including an opening disposed in a first dielectric layer, a bilayer metal layer and a conductive bulk layer. The bilayer metal layer is disposed in the opening, wherein the bilayer metal layer includes a first metal layer and a second metal layer disposed on the first metal layer and having <110> crystalline orientation and <211> crystalline orientation. The conductive bulk layer is filled in the opening.

The semiconductor device of the present invention mainly utilizes tantalum nitride and bilayer alpha-phase tantalum to function as the barrier layer thereof, such that, the second layer of the bilayer alpha-phase tantalum may perform like a pure metal state, thereby achieving the purpose of reducing the entire resistance capacitance of the plug structure and improving the element performance of the plug structure.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred embodiments will be described in detail. The preferred embodiments of the present invention are illustrated in the accompanying drawings with numbered elements.

Figure 1:
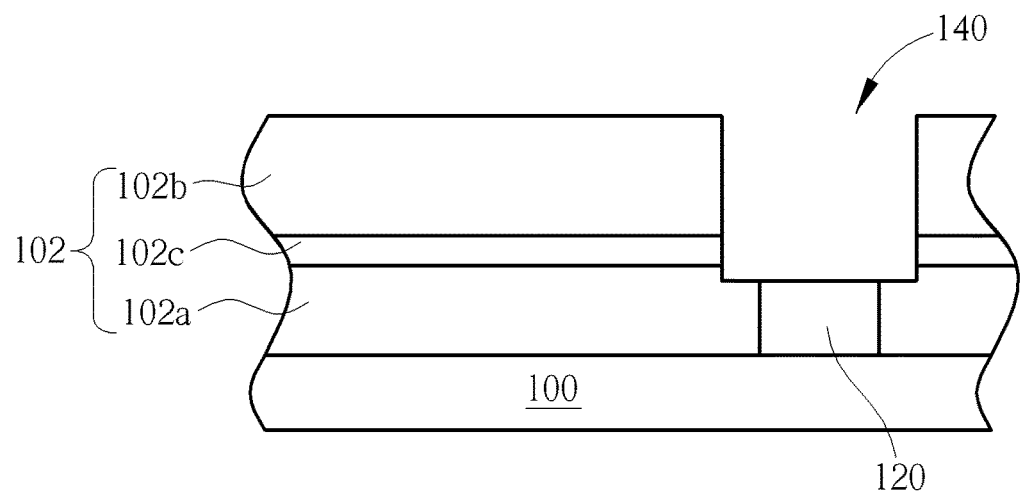
FIG. 1 to FIG. 2 are schematic diagrams illustrating a forming method of a semiconductor device according to a first embodiment of the present invention.
Figure 2:
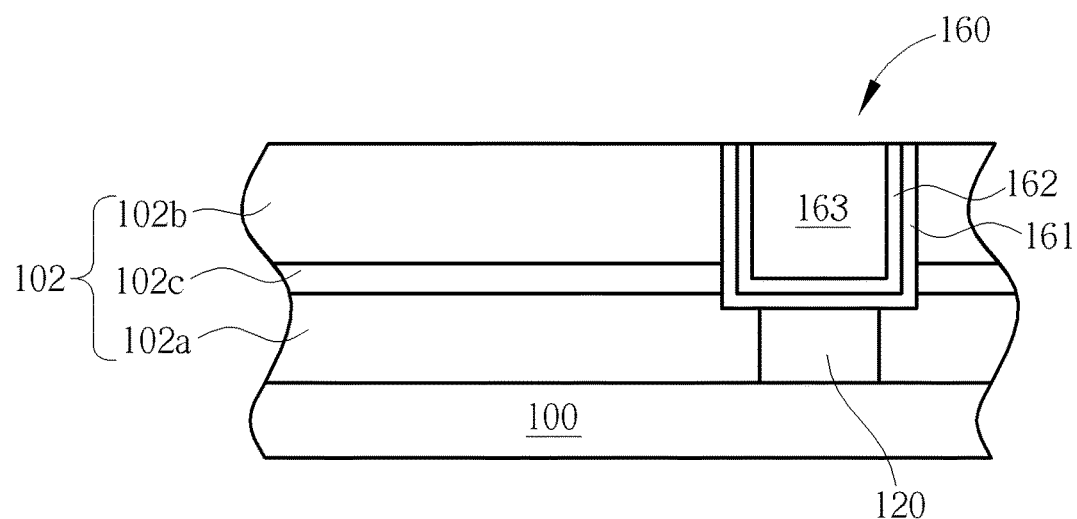
Figure 3:
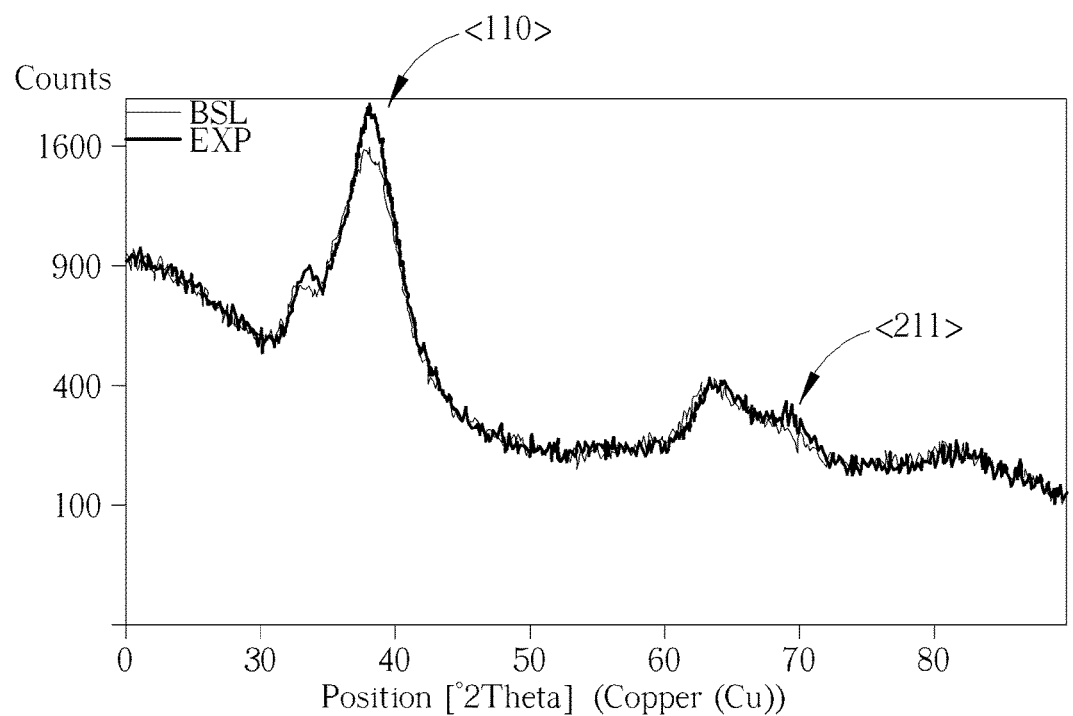
FIG. 3 to FIG. 4 are schematic diagrams illustrating experimental results of X-ray diffraction scan test and energy dispersive spectrometer test illustrating for the second barrier layer according to the first embodiment of the present invention.

Please refer to FIG. 1 to FIG. 3, which are schematic diagrams illustrating a forming method of a semiconductor device according to the first embodiment of the present invention. First of all, a substrate is provided, wherein the substrate may be a dielectric layer 100 formed on a semiconductor substrate (not shown in the drawings). Furthermore, the semiconductor substrate may include other semiconductor elements formed thereon or therein. For example a plurality of fin shaped structures (not shown in the drawings) and a shallow trench isolation (not shown in the drawings) surrounding the fin shaped structures may be formed optionally in the semiconductor substrate; or a metal oxide semiconductor transistor (not shown in the drawings) may be formed optionally on the semiconductor substrate, but is not limited thereto. In another embodiment, the substrate may also be a semiconductor substrate, such as a silicon substrate, an epitaxial silicon substrate or a silicon-on-insulator (SOI) substrate; or a non-semiconductor substrate, such as a glass substrate, but is not limited thereto.

Next, as shown in FIG. 1, at least one conductive layer 120 is formed in an interlayer dielectric layer 102 formed on the dielectric layer 100. In one embodiment, the interlayer dielectric layer 102 may include a multilayer structure. For example, the interlayer dielectric layer 102 may include a first dielectric layer 102a and a second dielectric layer 102b including a dielectric material having a dielectric constant (k value) lower than 3.9, such as silicon oxide, silicon oxynitride, silicon carbonitride, but is not limited thereto. In another embodiment, the interlayer dielectric layer 102 may further include an etch stop layer 102c, for example being formed between the first dielectric layer 102a and the second dielectric layer 102b, to function as a stop layer while forming an opening in the following steps. However, in another embodiment, an interlayer dielectric layer (not shown in the drawings) having a monolayer structure may also be formed according to the practical requirements.

It is worth noting that, the conductive layer 120 may be any conductive unit or metal contact, such as a contact plug, a via plug or a wiring, and which is preferably formed only in the first dielectric layer 102a, as shown in FIG. 1. However, the formation of conductive layer 120 is not limited to the aforementioned example, and in the embodiment of having the semiconductor substrate as the substrate, the conductive layer may also be a gate structure (not shown in the drawings) formed on the semiconductor substrate, or a source/drain (not shown in the drawings) formed in the semiconductor substrate.

In the following, an opening 140 which is electrically connected to the conductive layer 120 may be formed in the interlayer dielectric layer 102, as shown in FIG. 1. Precisely, the method of forming the opening 140 includes firstly forming a patterned photoresist layer (not shown in the drawings) on the interlayer dielectric layer 102, with the patterned photoresist layer preferably having a pattern used to define the opening 140, and performing an etching process to form the opening 140 being not penetrated through the interlayer dielectric layer 102. In other words, the opening 104 only penetrates the second dielectric layer 102b and the etching stop layer 102c of the interlayer dielectric layer 102, so that a top surface of the conductive layer 120 formed in the first dielectric layer 102a may be directly exposed from the opening 140, as shown in FIG. 1. Also, it is noted that, the detailed method of forming the first patterned photoresist layer shall be well known in the art and will not be further detailed herein.

Then, as shown in FIG. 2, a plug forming process is carried out in the opening 140, to form a plug structure 160 electrically connected to the conductive layer 120. In the present embodiment, the plug forming process may include performing a pre-cleaning process and/or cleaning process on surfaces of the opening 140, for example, treating with hydrogen carried by helium (5% $H_2$/He) for about 300 seconds or more. After these, a physical vapor deposition process (PVD) is performed to sequentially deposit a first barrier material layer (not shown in the drawings) a second barrier material layer (not shown in the drawings) and a conductive material layer (not shown in the drawings), and then, a planarization process, such as a chemical mechanical polishing (CMP) or etching process is performed, to remove the conductive material layer, the second barrier material layer, and the first barrier material layer disposed on the interlayer dielectric layer 102, thereby forming the plug structure 160 shown in FIG. 2. Please note that the forming method of the plug structure of the present invention is not limited to the aforementioned process, and may include other forming steps in other embodiments.

Figure 4:
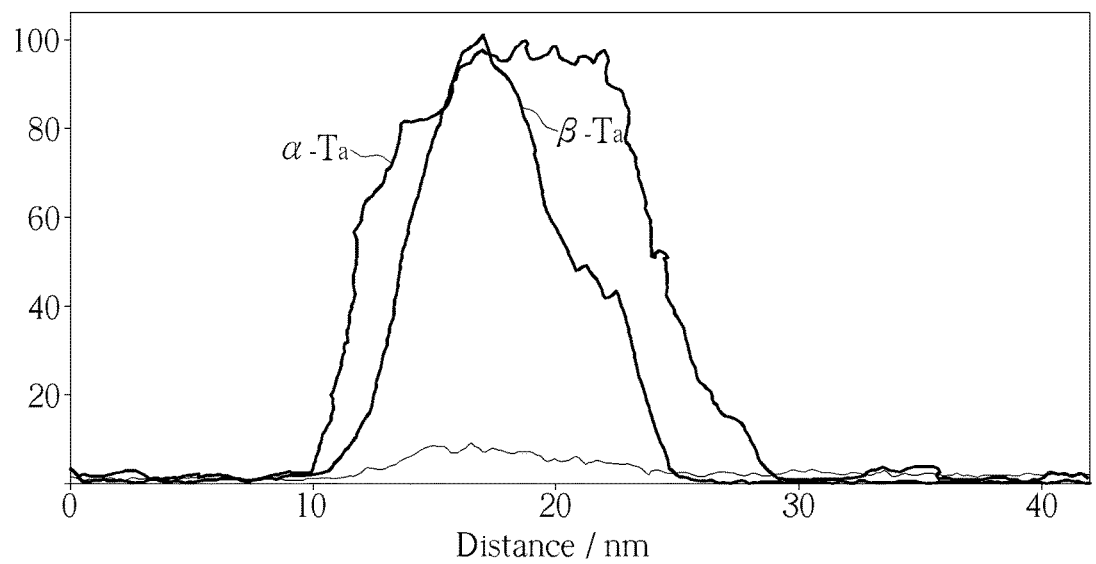

Precisely speaking, the plug structure 160 includes a first barrier layer 161, a second barrier layer 162 and a conductive bulk layer 163 formed in the opening 140. The first barrier layer 161 preferably includes a metal nitride layer, such as tantalum nitride (TaN); the second barrier layer 162 preferably includes metal which is the same as that of the metal nitride layer, such as a tantalum layer; and the conductive bulk layer may include a copper layer. It is worth mentioning that in one embodiment of the present invention, the second barrier layer 162 preferably includes a tantalum layer consisting of relatively higher alpha-phase tantalum ($\alpha$-Ta), more preferably only consisting of alpha-phase tantalum. It is noted that tantalum exists in two crystalline phases, i.e., alpha-phase tantalum and beta-phase tantalum. The alpha-phase tantalum exhibits a relatively better ductility and low resistivity about 15$\mu\Omega$-cm to 25$\mu\Omega$-cm, due to obtaining preferable crystallization phase and crystallinity in comparison with the beta-phase tantalum. It is also noted that, according to the experimental results of X-ray diffraction (XRD) scan test and energy dispersive spectrometer (EDS) test shown in FIGS. 3-4, the second barrier layer 162 of the present embodiment contains pure alpha-phase tantalum having <110> crystalline orientation in the majority and <211> crystalline orientation without any detectable beta-phase tantalum. Furthermore, a ratio between the <110> crystalline orientation and the <211> crystalline orientation in the pure alpha-phase tantalum is about 1:1 to 5:1.

Through the aforementioned steps, the semiconductor device of the first embodiment of the present invention is obtained. In the first embodiment of the present invention, the semiconductor device utilizes tantalum nitride and low resistivity alpha-phase tantalum to function as the barrier layer thereof, so as to replace conventional tantalum nitride/ tantalum barrier layer. In this way, such barrier layer of the present invention may reduce the resistance capacitance of plug structure by about 10% while maintaining the ability thereof to prevent copper diffusion, so as to obtain a plug structure with preferred element performance.

However, people skilled in the art shall easily realize that the fabrication of the semiconductor device of the present invention is not limited to the aforementioned process, and may include other forming methods. Thus, the following description will detail the different embodiments of the semiconductor device and the forming method thereof of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 5:
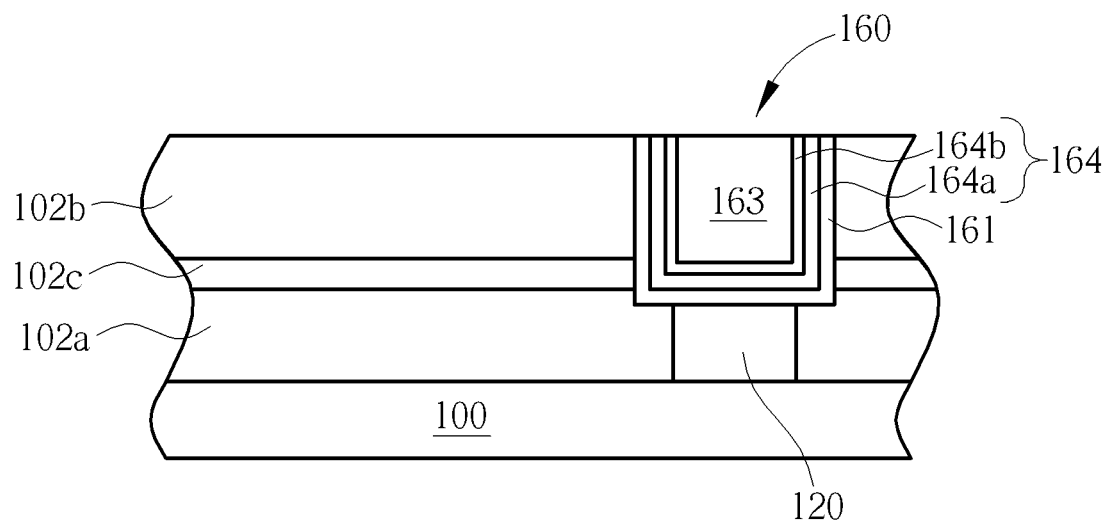
FIG. 5 to FIG. 6 are schematic diagrams illustrating a forming method of a semiconductor device according to a second embodiment of the present invention.
Figure 6:

Please refer to FIG. 5 and FIG. 6, which are schematic diagrams illustrating a forming method of a semiconductor device according to the second embodiment of the present invention. The formal steps in the present embodiment are similar to those in the first embodiment shown in FIGS. 1-2, and the difference therebetween is in selectively forming a second barrier layer 164 having a bilayer metal layer on the first barrier layer 161. Precisely, in one embodiment of the present invention, the bilayer metal layer includes a first layer 164a and a second layer 164b formed on the first layer 164a shown in FIGS. 5-6. The first layer 164a and the second layer 164b preferably include the same metal as that of the metal nitride layer (namely, the first barrier layer 161), but in a relatively greater concentration, and more preferably include pure metal layer. For example, the metal nitride layer may include 50% to 60% tantalum, and the first layer 164a and the second layer 164b may include more than 80% tantalum.

In one embodiment, the formation of the first layer 164a and the second layer 164b for example includes sequentially forming two pure metal layers, such as two pure tantalum layers, and an interface may be generated between the two pure metal layers. After these, the metal concentration in one of the two pure tantalum layers which directly contacts the metal nitride layer (namely, the first layer 164a) may be affected by diffused nitrogen generated from the metal nitride layer in the subsequently processes, such as a thermal process, thereby changing the metal concentration of the pure tantalum layer (the first layer 164a) which directly contacts the metal nitride layer, especially in comparison with the other pure tantalum layer (the second layer 164b). Accordingly, after the aforementioned thermal process, the second layer 164b of the bilayer metal layer may have relatively greater metal concentration than the first layer 164a of the bilayer metal layer. For example, in one embodiment, the second layer 164b may include about 99% or more than 99% tantalum, and the first layer 164a may include about 80% to 95% tantalum. In other words, the second layer 164b may be protected by the first layer 164a and the interface, such that, the metal concentration thereof may not be affected by the diffused nitrogen, and still be pure metal state.

Moreover, in one embodiment as shown in FIG. 6, the second layer 164b preferably has a relatively greater thickness than the first layer 164a which directly contacts the metal nitride layer. For example, the second layer 164b may have a thickness T2, being about 50 angstroms to 65 angstroms; and the first layer 164a may have a thickness T1, being about 10 angstroms to 15 angstroms, thereby making the entire thickness of the second barrier layer 164 being about 60 angstroms to 80 angstroms, with a thickness ratio (T1:T2) therebetween being 1:5. In another embodiment, the first layer 164a and the second layer 164b both consist of pure alpha-phase tantalum, wherein a ratio between the <110> crystalline orientation and the <211> crystalline orientation in the pure alpha-phase tantalum is about 1:1 to 5:1. It is worth mentioning that the second layer 164 preferably only consists of low resistivity alpha-phase tantalum.

The semiconductor device of the present embodiment includes the bilayer alpha-phase tantalum, such that, the present embodiment not only may obtain the reduced resistance capacitance, but also may further utilize the bilayer alpha-phase tantalum to block diffused nitrogen possibly diffused from the metal nitride layer (first barrier layer 161). In other words, the semiconductor device of the present embodiment mainly utilizes the first layer 164a directly contacting the metal layer and the interface disposed between the first layer 164a and the second layer 164b to function as a buffer layer, thereby blocking diffused nitrogen into the second barrier layer 164 to affect the resistance capacitance thereof. Thus, the second layer 164b of the present embodiment may still contain 99% or more than 99% alpha-phase tantalum, thereby performing like a pure metal layer to achieve reduced resistance capacitance. Although the second barrier layer 164 having the bilayer metal layer is exemplified in the present embodiment, the practical number of layer of the second barrier layer 164 is not limited thereto. In another embodiment, the second barrier layer (not shown in the drawings) may include more than two layers of metal stacked layers, so as to block the diffused nitrogen from the metal nitride layer and to reduce the entire resistance capacitance further. Except for the above mentioned differences, other steps of the present embodiment are all similar to those in the aforementioned first embodiment and will not be further detailed herein.

Through the aforementioned steps, the semiconductor device of the second embodiment of the present invention is obtained. In the second embodiment, the semiconductor device utilizes tantalum nitride and bilayer alpha-phase tantalum to function as the barrier layer, such that, the second layer of the bilayer alpha-phase tantalum may still be the pure metal state, thereby reducing the entire resistance capacitance of the plug structure and obtaining a plug structure with preferred element performance.

Figure 7:
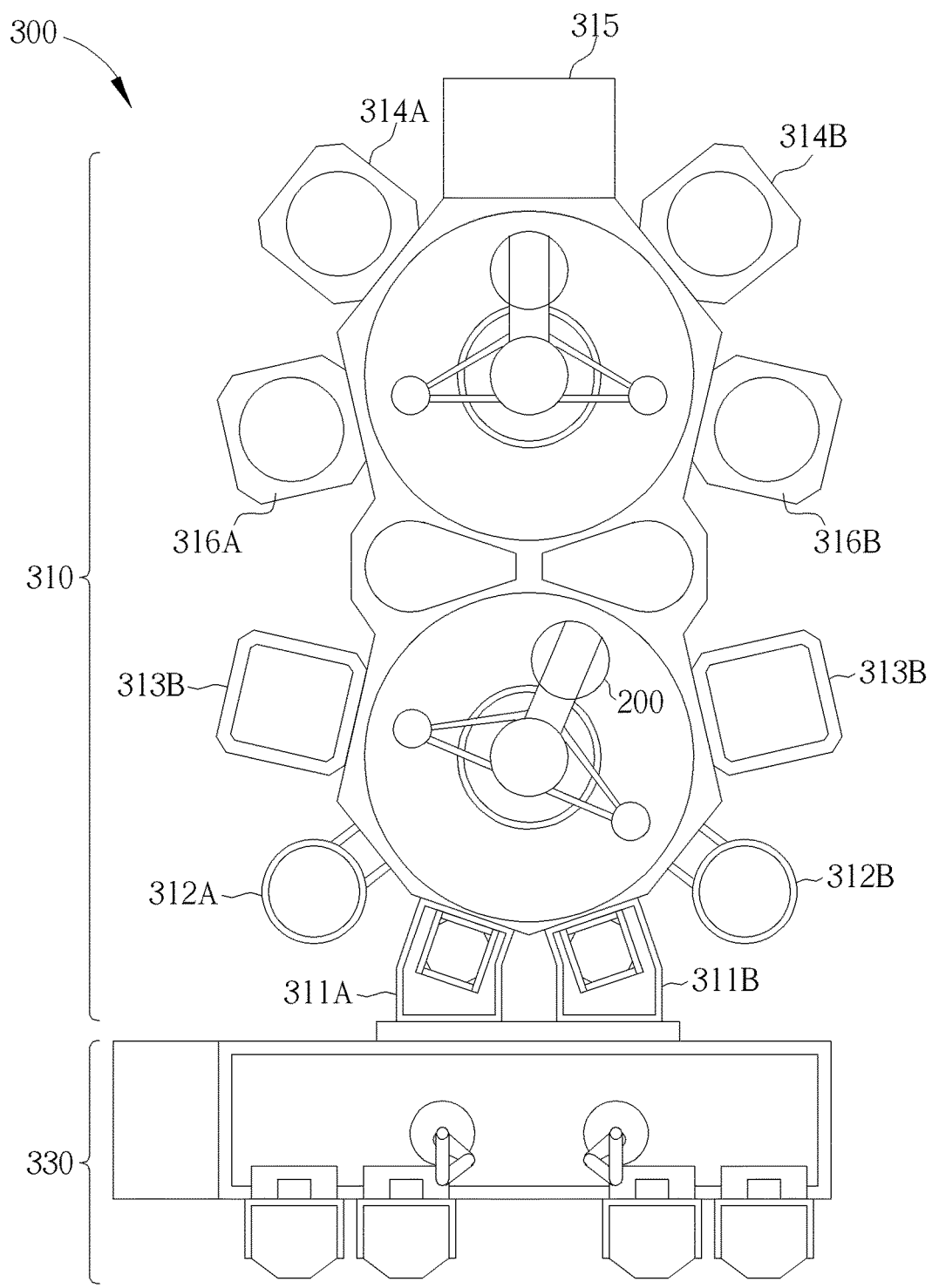
FIG. 7 is a schematic diagram illustrating a forming step of a semiconductor device according to a preferred embodiment of the present invention.

Please refer to FIG. 7, which is a schematic diagram illustrating a forming step of a semiconductor device according to a preferred embodiment of the present invention. As shown in FIG. 7, a physical vapor deposition (PVD) apparatus 300 is provided, and which includes a vacuum-tight processing platform 310 and a factory interface 330. The factory interface 330 is coupled to the vacuum-tight processing platform 310 through the load lock vacuum chambers 311A and 311B, so that, a factory interface robot (not shown in the drawings) may be used to transfer the substrate 200 from the factory interface 330 to the vacuum-tight processing platform 310 for processing through the load lock vacuum chambers 311A, 311B. Precisely, after the substrate 200 is transferred into the vacuum-tight processing platform 310, the substrate 200 is further transferred in processing chambers 312A, 312B, 313A, 313B sequentially for degassing process, pre-cleaning process and cleaning process. After these, the substrate 200 is transferred in processing chambers 314A, 314B, 315 for depositing process, such as DC magnetron plasma deposition process, so as to deposit the aforementioned first barrier material layer (such as a metal nitride layer, i.e. tantalum nitride) and a second barrier layer (such as monolayer alpha-phase tantalum layer or bilayer alpha-phase tantalum layer) on the substrate 200. Finally, the substrate 200 is transferred in processing chambers 316A, 316B for forming the aforementioned conductive material layer (such as copper layer) on the substrate 200. Through the above-mentioned steps, the deposition process of the preferred embodiment of the present invention is complete, and then, the semiconductor device having the plug structure 160 shown in FIG. 2 and FIG. 6 with a low resistance capacitance may be obtained substantially by partially removing the conductive material layer, the second barrier material layer and the first barrier material layer via a planarization process, such as a chemical mechanical polishing process or an etching back process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
an opening disposed in a first dielectric layer;
a bilayer metal layer disposed in the opening, wherein the bilayer metal layer comprises a first metal layer and a second metal layer disposed on the first metal layer and both the first metal layer and the second metal layer having <110> crystalline orientation and <211> crystalline orientation; and
a conductive bulk layer filled in the opening.
2. The semiconductor device according to claim 1, wherein the second metal layer comprises a pure metal layer.
3. The semiconductor device according to claim 1, wherein the bilayer metal layer consists of tantalum.
4. The semiconductor device according to claim 3, wherein the bilayer metal layer only comprises alpha-phase tantalum.

5. The semiconductor device according to claim 1, further comprising: a metal nitride layer disposed in the opening, under the bilayer metal layer.

6. The semiconductor device according to claim 1, wherein the metal nitride layer has a metal concentration less than a metal concentration of the first metal layer.

7. The semiconductor device according to claim 1, wherein a ratio between the <110> crystalline orientation and the <211> crystalline orientation is substantially between 1:1 to 5:1.

* * * * *